(12) United States Patent
Lee et al.

(10) Patent No.: US 8,633,396 B2
(45) Date of Patent: Jan. 21, 2014

(54) DIE MOUNTING SUBSTRATE AND METHOD OF FABRICATING THE SAME

(75) Inventors: Eung Suek Lee, Seoul (KR); Jee Soo Mok, Gyunggi-do (KR); Jun Oh Hwang, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 408 days.

(21) Appl. No.: 12/714,077

(22) Filed: Feb. 26, 2010

(65) Prior Publication Data

US 2011/0120758 A1    May 26, 2011

(30) Foreign Application Priority Data

Nov. 25, 2009    (KR) .................... 10-2009-0114719

(51) Int. Cl.
*H05K 1/09* (2006.01)

(52) U.S. Cl.
USPC ............ 174/257; 174/260; 174/261; 361/760

(58) Field of Classification Search
USPC ........... 174/257, 778, 777, 260, 261; 361/760
See application file for complete search history.

(56) References Cited

U.S. PATENT DOCUMENTS 6,822,324 B2 * 11/2004 Tao et al. ...................... 257/710
7,382,057 B2 *  6/2008 Hsu .............................. 257/778

FOREIGN PATENT DOCUMENTS

| JP | 2000-294892 | * 10/2000 | ............... H05K 1/18 |
| JP | 2006-152312 | 6/2006 | |
| KR | 10-0866577 | 10/2008 | |

OTHER PUBLICATIONS

Office Action from counterpart Korean Patent Application No. 10-2009-0114719, mailed May 19, 2011, 6 pages.

* cited by examiner

*Primary Examiner* — Timothy Thompson
*Assistant Examiner* — Andargie M Aychillhum
(74) *Attorney, Agent, or Firm* — Bracewell & Giuliani LLP

(57) ABSTRACT

Disclosed is a die mounting substrate, which includes a mounting substrate having a pad, a die having a terminal and surface-mounted on the mounting substrate, and a conductive paste bump formed on the pad or the terminal so as to connect the pad and the terminal to each other. When the die is connected and mounted on the mounting substrate using the conductive paste bump, shear stress is relieved thus preventing reliability from decreasing due to a difference in the coefficient of thermal expansion between the die and the mounting substrate, and also preventing the force of adhesion of the bump from decreasing due to the reduction in size of the pad of the mounting substrate.

1 Claim, 3 Drawing Sheets

DIE MOUNTING SUBSTRATE AND METHOD OF FABRICATING THE SAME

CROSS REFERENCE TO RELATED APPLICATION

This application claims the benefit of Korean Patent Application No. 10-2009-0114719, filed Nov. 25, 2009, entitled "A die mounting substrate and a fabricating method the same", which is hereby incorporated by reference in its entirety into this application.

BACKGROUND OF THE INVENTION

1. Technical Field

The present invention relates to a die mounting substrate and a method of fabricating the same.

2. Description of the Related Art

With the recent reduction in size and fabrication cost of electronic apparatuses, electronic components such as semiconductor chips or packages for molding the semiconductor chips, including BGA, CSP, WLP and so on, are surface-mounted on a mounting substrate by a flip chip bonding process using a solder base material (solder ball).

However, the flip chip bonding process using solder balls is difficult to apply when a mounting substrate has the same size as that of an electronic component. In particular, in the case where soldering is performed using a typical solder paste having an average particle size of 5~20 μm, solder balls have a diameter of 105~120 μm, undesirably making it difficult to cope with fineness of a circuit pattern. Also, because solder balls subjected to reflow have a spherical shape, the adhesion area of the solder balls to the circuit pattern is reduced, undesirably weakening an interfacial adhesion force and bringing adjacent solder balls into contact with each other. As well, in order to solve problems with reliability resulting from different coefficients of thermal expansion between the mounting substrate and the electronic component, shear stress should be relieved at the connection portions. In the case where the height of solder balls is increased, shear stress at the connection portions may be relieved. However, limitations are imposed on increasing the height of solder balls which use a solder base material.

With the goal of solving the above problems, there have been proposed methods of forming copper pillars on the mounting substrate or electronic component through plating and photolithography and then printing solder balls thereon, but the plating and photolithography increase the process costs and are complicated, undesirably lowering the process yield.

In addition, although attempts to use a double solder ball structure are being made, problems of interfacial adhesion force of the solder balls to the circuit pattern being reduced due to fineness of the circuit pattern and of adjacent solder balls coming into contact with each other still occur.

SUMMARY OF THE INVENTION

Accordingly, the present invention has been made keeping in mind the problems encountered in the related art and the present invention is intended to provide a die mounting substrate in which shear stress is relieved thus preventing reliability from decreasing due to a difference in the coefficient of thermal expansion between a die and a mounting substrate and also preventing a force of adhesion of bumps from decreasing due to the fineness of a circuit pattern, and a method of fabricating the same.

An aspect of the present invention provides a die mounting substrate, including a mounting substrate having a pad, a die having a terminal and surface-mounted on the mounting substrate, and a conductive paste bump formed on the pad or the terminal so as to connect the pad and the terminal to each other.

In this aspect, the conductive paste bump may have the same size as the pad or the terminal on which the conductive paste bump is formed.

In this aspect, one side of the conductive paste bump may have the same size as the pad, and the other side of the conductive bump may have the same size as the terminal.

In this aspect, the conductive paste bump may have the cross-sectional shape of a trapezoid or an inverted trapezoid.

In this aspect, the conductive paste bump may include copper, silver, or carbon nanotubes.

In this aspect, an underfill resin may be applied between the mounting substrate and the die.

Another aspect of the present invention provides a method of fabricating the die mounting substrate, including (A) preparing a mounting substrate having a pad and a die having a terminal, (B) printing a conductive paste bump on the pad or the terminal, and (C) connecting the pad and the terminal to each other using the conductive paste bump, thus surface-mounting the die on the mounting substrate.

In this aspect, the conductive paste bump may be printed by means of a screen printer using a conductive paste to have a predetermined height through continuous printing.

In this aspect, one side of the conductive paste bump may have the same size as the pad, and the other side of the conductive bump may have the same size as the terminal.

In this aspect, the conductive paste bump may have the cross-sectional shape of a trapezoid or an inverted trapezoid.

In this aspect, the conductive paste bump may include copper, silver, or carbon nanotubes.

In this aspect, the method may further include (D) applying an underfill resin between the mounting substrate and the die, after (C).

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
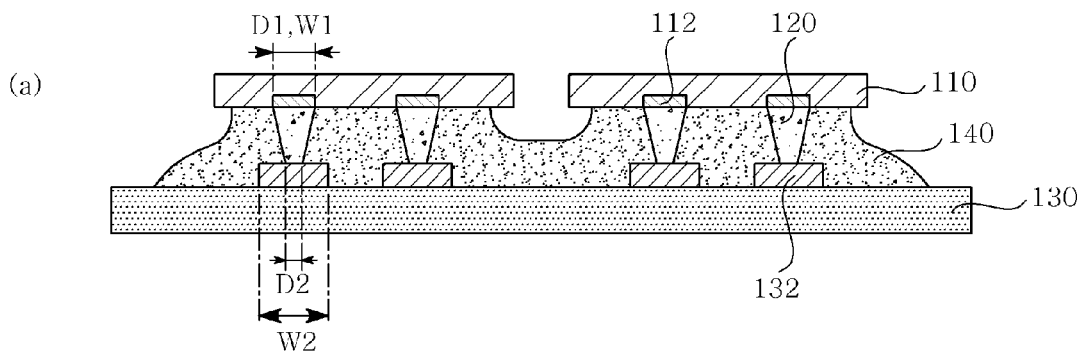
FIGS. 1A and 1B are cross-sectional views showing die mounting substrates according to embodiments of the present invention.
Figure 1:
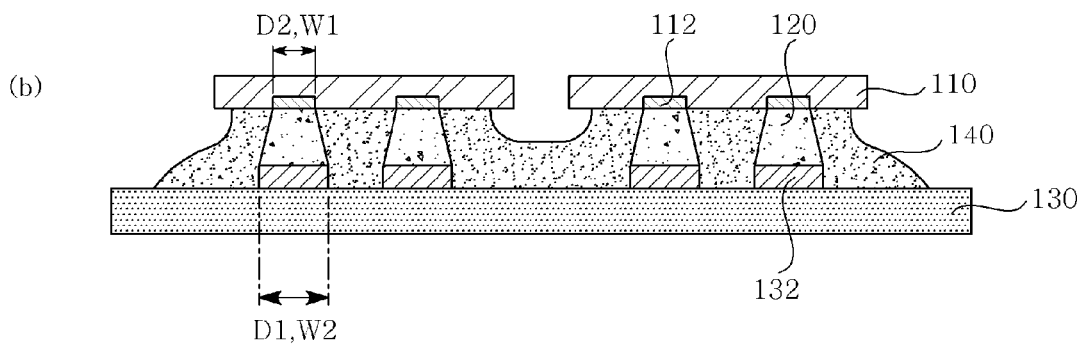

Hereinafter, embodiments of the present invention will be described in detail while referring to the accompanying drawings. Throughout the drawings, the same reference numerals are used to refer to the same or similar elements. Moreover, descriptions of known techniques, even if they are pertinent to the present invention, are regarded as unnecessary and may be omitted in so far as they would make the characteristics of the invention and the description unclear.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Die Mounting Substrate

FIGS. 1A and 1B are cross-sectional views showing die mounting substrates according to embodiments of the present invention. With reference to these drawings, the die mounting substrates 100a, 100b according to the embodiments of the present invention are described below.

As shown in FIGS. 1A and 1B, the die mounting substrate 100a, 100b according to the present embodiment is configured such that pads 132 of a mounting substrate 130 and terminals 112 of a die 110 are connected to each other using conductive paste bumps 120 and the die 110 is surface-mounted on the mounting substrate 130. Specifically, in the present embodiment, the die 110 is connected and mounted on the mounting substrate 130 not using solder balls but using conductive paste bumps 120.

The die 110 is configured such that the terminals 112 are formed on the upper surface of a wafer chip body made of silicon and including an integrated circuit (not shown) therein so as to form an electrical connection to the integrated circuit, and a passivation layer is formed on the upper surface of the wafer chip body to expose the terminals 112.

The conductive paste bumps 120 are used to connect the terminals 112 of the die 110 and the pads 132 of the mounting substrate 130 to each other, and are provided between the terminals 112 of the die 110 and the pads 132 of the mounting substrate 130.

As such, the conductive paste bumps 120 are formed to have the same size as the terminals 112 or the pads 132 on which they are formed, thus enlarging the adhesion area to thereby enhance the force of adhesion. This is possible because the conductive paste bumps 120 are formed by printing a conductive paste using a screen printing process, without an additional reflow process. The formation method thereof is described below.

For example, as shown in FIG. 1A, in the case when the conductive paste bumps 120 are formed on the terminals 112 of the die 110 and are mounted in inverted form on the mounting substrate, the conductive paste bumps 120 have the cross-sectional shape of an inverted trapezoid, and one side of the conductive paste bumps 120 is formed to have the same size as do the terminals 112. As shown in the cross-sectional view, the diameter D1 of one side of the conductive paste bumps 120 formed on the terminals 112 is formed to be the same as the width W1 of the terminals 112. Typically, the terminals 112 of a die 110 are smaller than the pads 132 of a mounting substrate. Thus, in the case when the conductive paste bumps 120 are formed to have the cross-sectional shape of an inverted trapezoid on the terminals 112, the diameter D2 of the other side of the conductive paste bumps 120 may be smaller than the width W2 of the pads 132.

As shown in FIG. 1B, in the case where the conductive paste bumps 120 are formed on the pads 132 of the mounting substrate 130 and are mounted on the mounting substrate 130, the conductive paste bumps 120 have the cross-sectional shape of a trapezoid, and one side of the conductive paste bumps 120 in contact with the pads 132 is formed to have the same size as do the pads 132. As shown in the cross-sectional view, the diameter D1 of one side of the conductive paste bumps 120 formed on the pads 132 is formed to be the same as the width W2 of the pads 132. Because the diameter D2 of the other side of the conductive paste bumps 120 having the trapezoidal shape is formed to be smaller than the diameter D1 of one side thereof, the diameter D2 of the other side of the conductive paste bumps 120 in contact with the terminals 112 is made to be the same as the width W1 of the terminals 112, thus maximizing the area of contact between the terminals 112 and the conductive paste bumps 120.

The conductive paste bumps 120 may be made of any conductive material, for example, copper (Cu) or silver (Ag) paste. In the case of the Ag paste, because the Ag particles have an average diameter of about 1~3 µm, it is possible to print the conductive paste bumps 120 having a diameter of about 80 µm, thus coping with fineness of the terminals 112 or the pads 132.

In addition, as shown in Table 1 below, the conductive paste bumps 120 may include carbon nanotubes having much higher electrical properties compared to a metal material such as aluminum or copper which is superior in terms of electrical conductivity and specific resistance, thus improving interlayer connection reliability and increasing heat dissipating efficiency.

TABLE 1

| Physical property | Carbon Nanotubes | Comparative Materials |
|---|---|---|
| Density | 1.33~1.40 g/cm$^3$ | 2.7 g/cm$^3$ (Al) |
| Current density | 1 × 10$^9$ A/cm$^2$ | 1 × 10$^6$ A/cm$^2$ (copper cable) |
| Thermal conductivity | 6000 W/mK | 400 W/mk (copper) |
| Specific resistance | 1 × 10$^{-10}$ Ωcm | 1 × 10$^{-10}$ Ωcm (copper) |

The mounting substrate 130 indicates a printed circuit board on which the die 110 is mounted. The configuration thereof is not particularly limited, and any configuration may be used so long as pads 132 are formed on an insulating layer.

In order to improve reliability of the connection of the conductive paste bumps 120 for connecting the die 110 and the mounting substrate 130 and to protect the substrate from the external environment, an underfill resin 140 may be applied between the die 110 and the mounting substrate 130.

Fabrication of Die Mounting Substrate

FIGS. 2 to 5 are cross-sectional views sequentially showing the process of fabricating the die mounting substrate according to the embodiment of the present invention. With reference to these drawings, the method of fabricating the die mounting substrate according to the present embodiment is described below.

Figure 2:
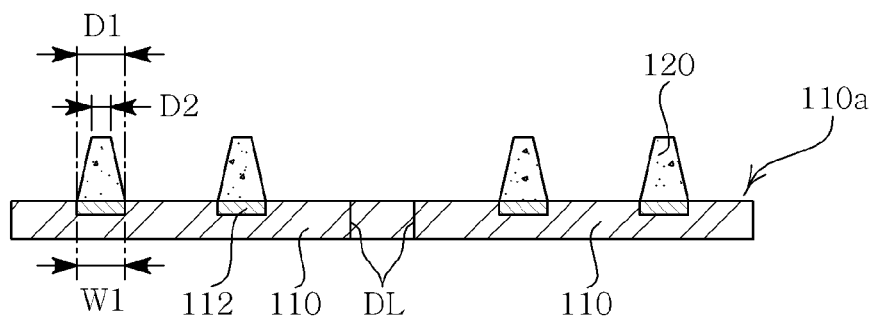
FIGS. 2 to 5 are cross-sectional views sequentially showing a process of fabricating a die mounting substrate according to an embodiment of the present invention.

As shown in FIG. 2, conductive paste bumps 120 are printed on the terminals 112 of a wafer chip 110a.

As such, the conductive paste bumps 120 may be printed on the terminals of the wafer chip 110a using a screen printing process for printing bumps in which conductive paste is transferred via a mask having openings. Specifically, the screen printing process is performed by applying the conductive paste on the upper surface of the mask and then pressing the conductive paste using a squeegee so that the conductive paste is transferred onto the terminals via the openings of the mask, and enables the formation of bumps having the desired height and shape by controlling the number of continuous cycles of a screen printer, the printing speed of a screen printer, the viscosity and thixotropy of a conductive paste, and the aspect ratio of a mask.

The conductive paste bumps 120 are formed such that the diameter D1 of one side of the conductive paste bumps 120 connected to the terminals 112 is greater than the diameter D2 of the other side thereof, so that the whole assumes, for example, the cross-sectional shape of a trapezoid. Because the conductive paste bumps 120 are formed such that the one side of the conductive paste bumps 120 connected to the terminals 112 has the same shape as the terminals 112, that is, D1=W1, the area of contact is enlarged thus enhancing the force of adhesion of the conductive paste bumps 120 to the terminals 112.

The height of the conductive paste bumps 120 may be increased by controlling the number of continuous cycles of a screen printer, and the viscosity and thixotropy of the conductive paste. For example, in the case where the conductive paste has a viscosity and thixotropy adapted for high printability, the number of continuous cycles of the screen printer is increased, thus increasing the height of the conductive paste bumps 120. In addition, the shape of the conductive paste bumps 120 may be varied by controlling the printing speed of the screen printer, the viscosity and thixotropy of the conductive paste, and the aspect ratio of the mask. As such, as the shape of the conductive paste bumps 120 is controlled, the area of contact with the terminals may be increased, thus improving reliability of adhesion.

Figure 3:
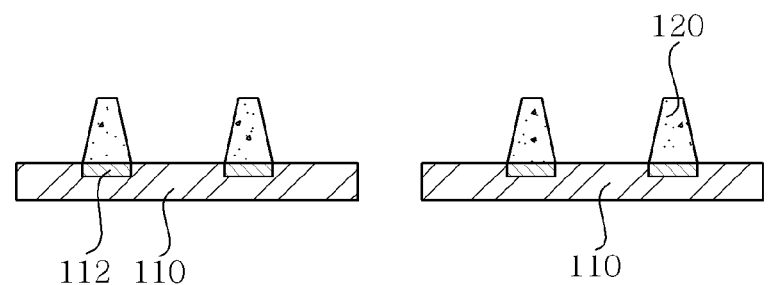

Next, as shown in FIG. 3, the wafer chip 110a is cut along the dicing line DL using a dicing device, thus preparing the die 110 on which the conductive paste bumps 120 are printed on the terminals 112.

Figure 4:
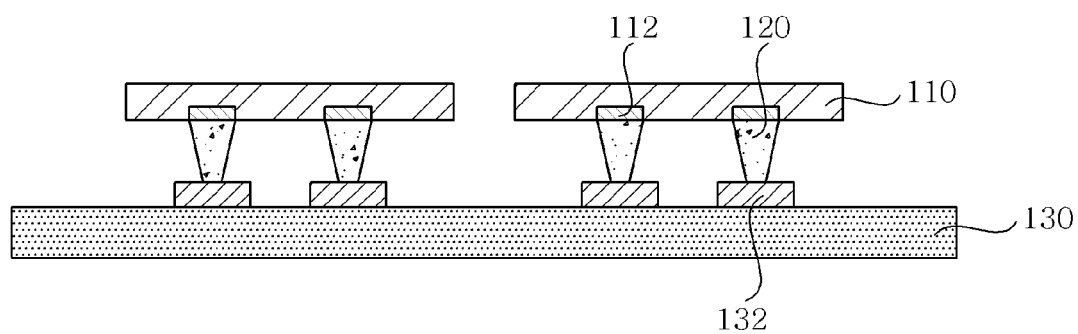

Next, as shown in FIG. 4, the conductive paste bumps 120 are connected to the pads 132 of the mounting substrate 130, thereby surface-mounting the die 110 on the mounting substrate 130.

Figure 5:
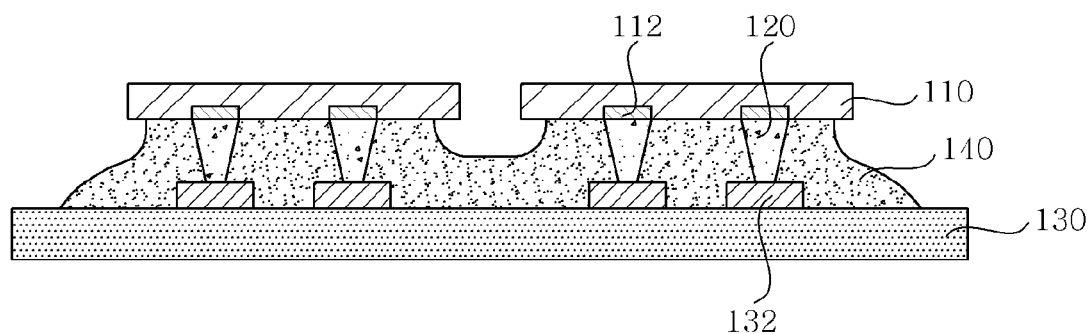

Finally, as shown in FIG. 5, an underfill resin 140 is applied between the die 110 and the mounting substrate 130 using a dispensing process and is then cured, thus completing the die mounting substrate 100a.

The method of fabricating the die mounting substrate 100a of FIG. 1A is described as above, and may be applied to the fabrication of the die mounting substrate 100b of FIG. 1B, as is apparent to those skilled in the art. Specifically, the conductive paste bumps 120 are formed on the pads 132 of the mounting substrate 130, the die 110 is mounted thereon, and the underfill resin 140 is applied, thus fabricating the die mounting substrate 100b as shown in FIG. 1B.

Screen Printer

Figure 6:
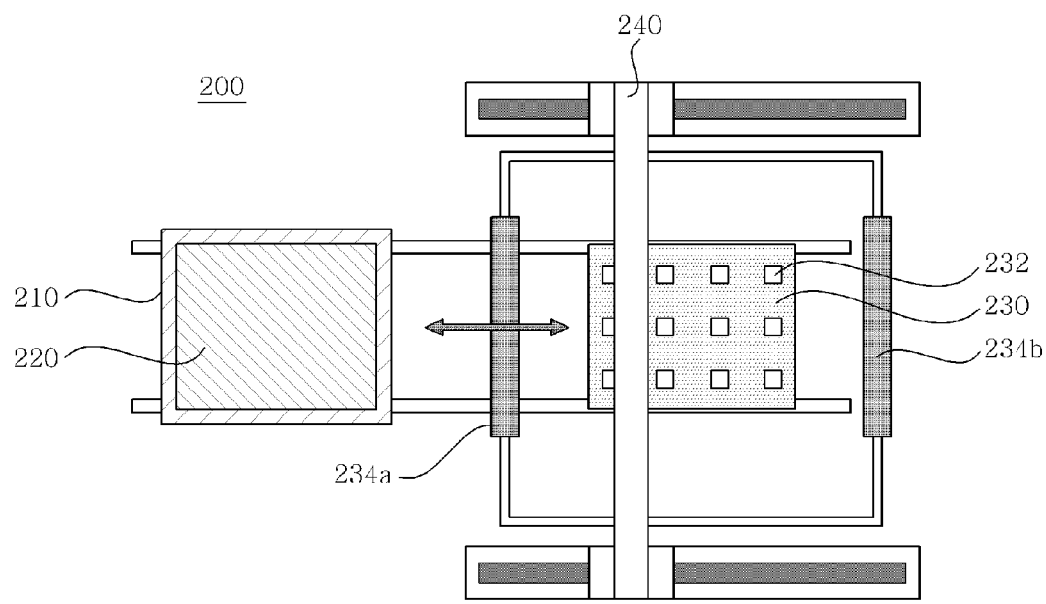
FIG. 6 is a schematic top plan view showing a screen printer used for bump printing according to the present invention.
Figure 7:
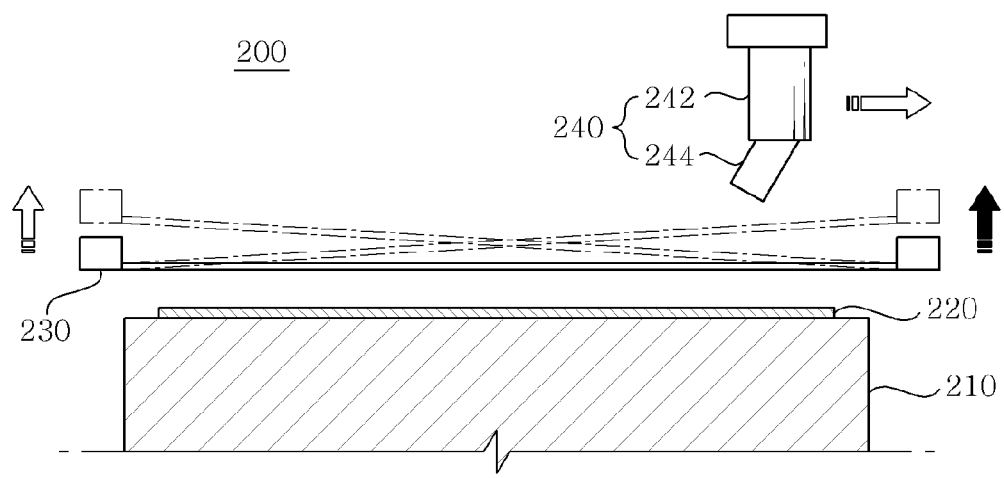
FIG. 7 is a schematic cross-sectional view showing a printing portion of the screen printer of FIG. 6.

FIG. 6 is a top plan view schematically showing a screen printer used for printing the bumps according to the present invention, and FIG. 7 is a cross-sectional view schematically showing the printing portion of the screen printer of FIG. 6. The screen printer 200 is described below with reference to these drawings.

As shown in FIGS. 6 and 7, a screen printer 200 is moved in the directions of X, Y, Z and θ, and includes a printing table 210 on which a printing member 220 is mounted through vacuum adsorption, a mask 230 which is installed in a non-contact state on the printing table 210 and has a plurality of openings 232 for printing the bumps, and a squeegee 240.

The mask 230 includes plate lifters 234a, 234b for lifting the side portions of the mask to 230 upward so that the spread of bumps is minimized thus maintaining the shape of bumps and also so that the printed bumps are not brought into contact with the mask thus improving the quality of the printing, depending on the direction of movement of the squeegee 240.

As such, the plate lifters 234a, 234b include a first plate lifter 234a and a second plate lifter 234b provided at both sides of the mask 230 in order to enable the separation of the plate along the direction of movement of the squeegee 240. For example, in the case where the squeegee is moved in a first printing direction (to the right in the drawing), the first plate lifter 234a lifts one side of the mask 230 upward so that the printed bumps are not brought into contact with the mask 230. In contrast, in the case where the squeegee is moved in a second printing direction (to the left in the drawing), the second plate lifter 234b lifts the other side of the mask 230 upward so that the printed bumps are not brought into contact with the mask 230.

The squeegee 240 functions to press the paste into the openings of the mask so that the bumps are printed on the printing member 220, and includes a squeegee holder 242 and a squeegee rubber 244 removably mounted to the squeegee holder 242. The squeegee 240 is moved upward/downward and rightward/leftward by a squeegee driving portion (not shown).

As described hereinbefore, the present invention provides a die mounting substrate and a method of fabricating the same. According to the present invention, a die is connected and mounted on a mounting substrate using conductive paste bumps, thus relieving shear stress, and thereby preventing the reliability from decreasing due to a difference in the coefficient of thermal expansion between the die and the mounting substrate and also preventing the force of adhesion of bumps from decreasing due to the reduction in size of the pads formed on the mounting substrate.

Also, according to the present invention, it is easy to control the height and shape of the conductive paste bumps for connecting the die and the mounting substrate, thus coping with the fineness of a circuit pattern and increasing the height of bumps, thereby relieving shear stress at the connected portions.

Although the embodiments of the present invention regarding the die mounting substrate and the method of fabricating the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A die mounting substrate, comprising: a mounting substrate having a pad; a die having a terminal and surface-mounted on the mounting substrate; and a conductive paste bump formed on the pad or the terminal so as to connect the pad and the terminal to each other, wherein the conductive paste bump is formed to have the same size as the pad or the terminal on which the conductive paste bump is formed, thus enlarging the adhesion area to enhance the force of adhesion; wherein the conductive paste bump has a cross-sectional shape of a trapezoid or an inverted trapezoid, and wherein the conductive paste bump comprises carbon nanotubes, wherein one side of the conductive paste bump has a size same as the pad, and the other side of the conductive bump has a size same as the terminal, wherein an underfill resin is applied between the mounting substrate and the die.

* * * * *